United States Patent
Yeh et al.

(10) Patent No.: US 7,031,196 B2
(45) Date of Patent: Apr. 18, 2006

(54) NONVOLATILE SEMICONDUCTOR MEMORY AND OPERATING METHOD OF THE MEMORY

(75) Inventors: Chih-Chieh Yeh, Taipei (TW); Wen-Jer Tsai, Hualien (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 76 days.

(21) Appl. No.: 10/757,073

(22) Filed: Jan. 14, 2004

(65) Prior Publication Data
US 2004/0156238 A1    Aug. 12, 2004

Related U.S. Application Data

(63) Continuation-in-part of application No. 10/113,356, filed on Mar. 29, 2002, now Pat. No. 6,690,601.

(51) Int. Cl.
*G11C 16/00* (2006.01)

(52) U.S. Cl. .............. 365/185.28; 365/185.19; 365/185.22; 365/185.29

(58) Field of Classification Search ............. None
See application file for complete search history.

(56) References Cited

U.S. PATENT DOCUMENTS

| | | | |
|---|---|---|---|
| 5,526,307 A * | 6/1996 | Yiu et al. | 365/185.01 |
| 5,576,995 A * | 11/1996 | Sato et al. | 365/185.27 |
| 5,619,051 A | 4/1997 | Endo | 257/316 |
| 5,768,192 A | 6/1998 | Eitan | |
| 5,898,197 A | 4/1999 | Fujiwara | 257/317 |
| 5,953,251 A * | 9/1999 | Caravella et al. | 365/185.18 |
| 5,953,255 A * | 9/1999 | Lee | 365/185.29 |
| 6,265,268 B1 | 7/2001 | Halliyal et al. | |
| 6,331,953 B1 * | 12/2001 | Wang et al. | 365/185.29 |
| 6,381,179 B1 | 4/2002 | Derhacobian et al. | |
| 2002/0000592 A1 | 1/2002 | Fujiwara | |
| 2003/0183873 A1 | 10/2003 | Fujiwara | |

FOREIGN PATENT DOCUMENTS

WO    WO 00/58969    10/2000

OTHER PUBLICATIONS

Yeh, et al., PHINES: A Novel Low Power Program/Erase, Small Pitch, 2-Bit per Cell Flash Memory, IEEE, 2002.

* cited by examiner

*Primary Examiner*—Tan T. Nguyen
(74) *Attorney, Agent, or Firm*—Baker & McKenzie LLP

(57) ABSTRACT

A method of programming the memory cell comprises setting the memory cell to an initial state of a first gate threshold voltage, performing a processing sequence including: applying a voltage bias between the gate and the first junction region to cause electric hole to migrate towards and be retained in the trapping layer, and evaluating a read current generated in response to the voltage bias to determine whether a second gate threshold voltage is reached, wherein the second gate threshold voltage is lower than the first gate threshold voltage. The processing sequence is repeated a number of times by varying one or more time the voltage bias between the gate and the first junction region until the second gate threshold voltage is reached and the memory cell is in a program state.

22 Claims, 19 Drawing Sheets

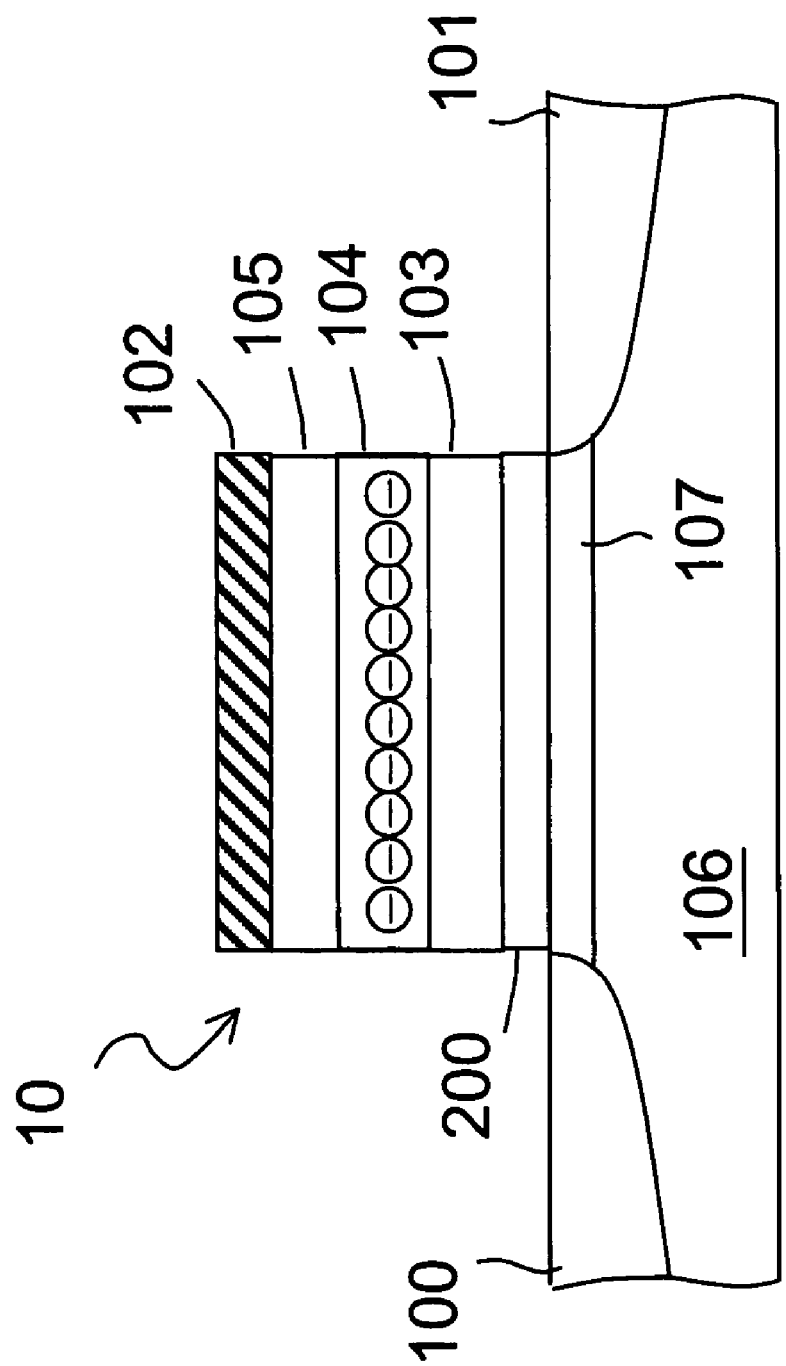

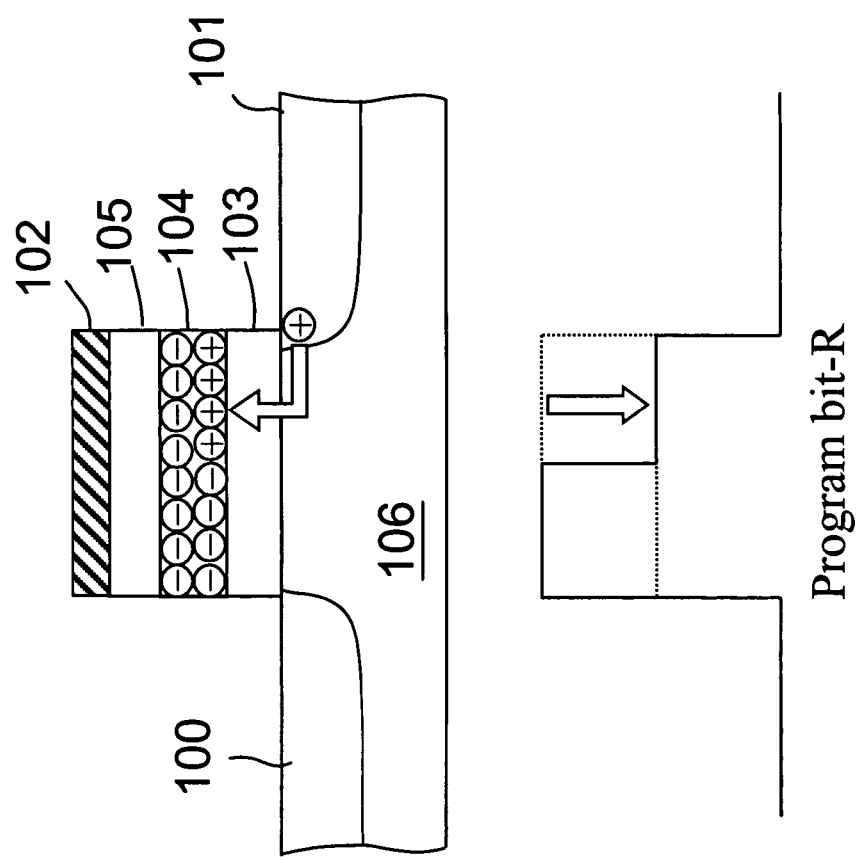

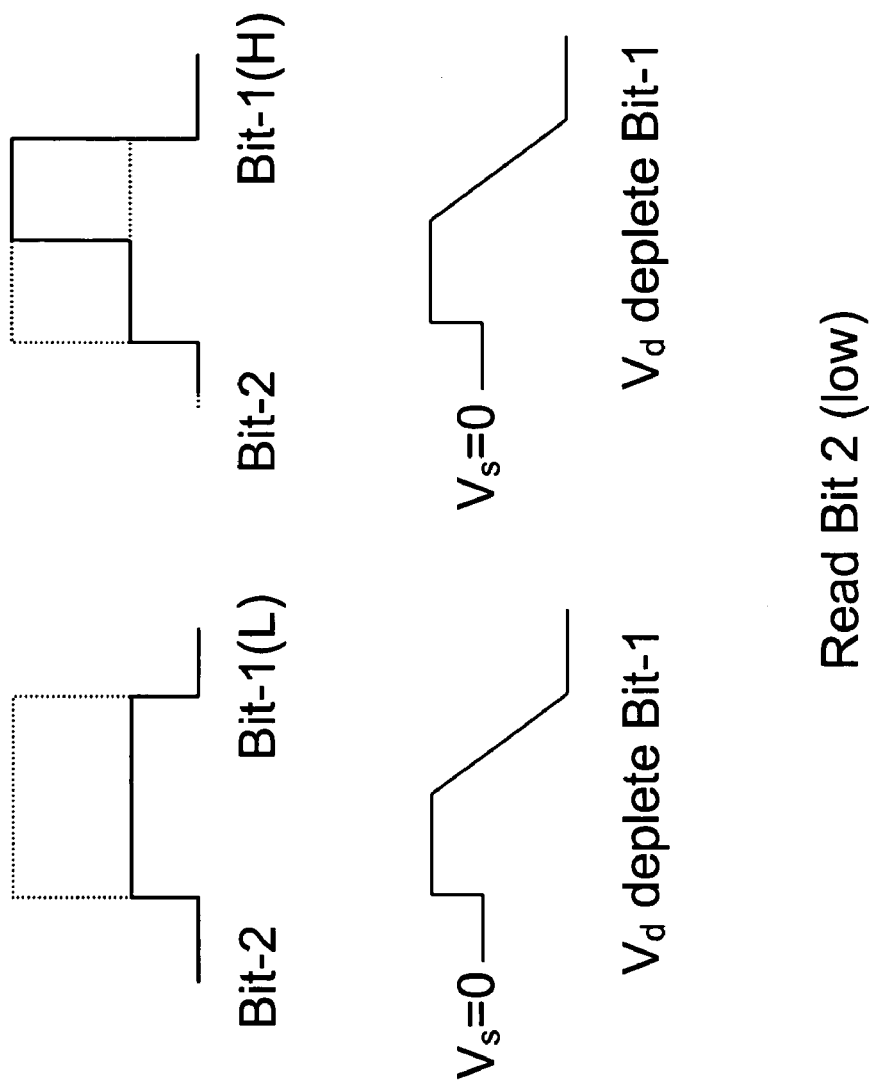

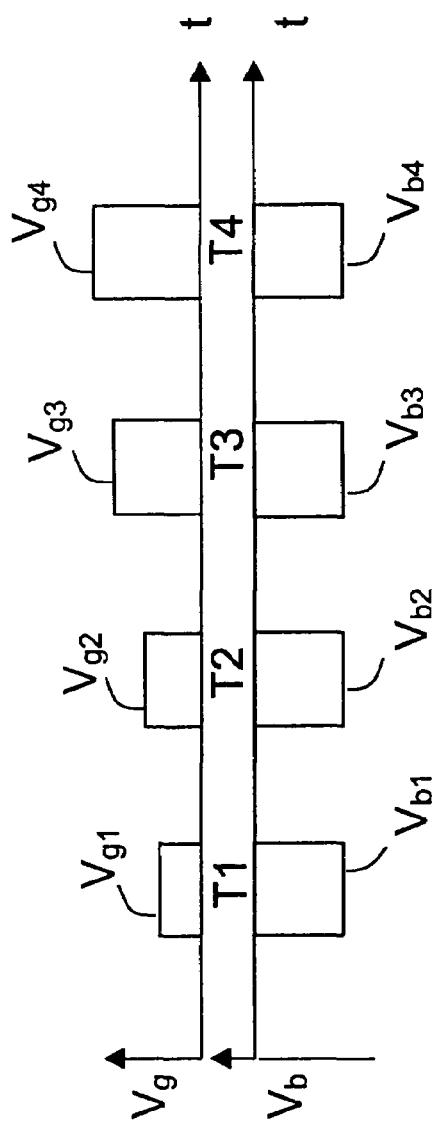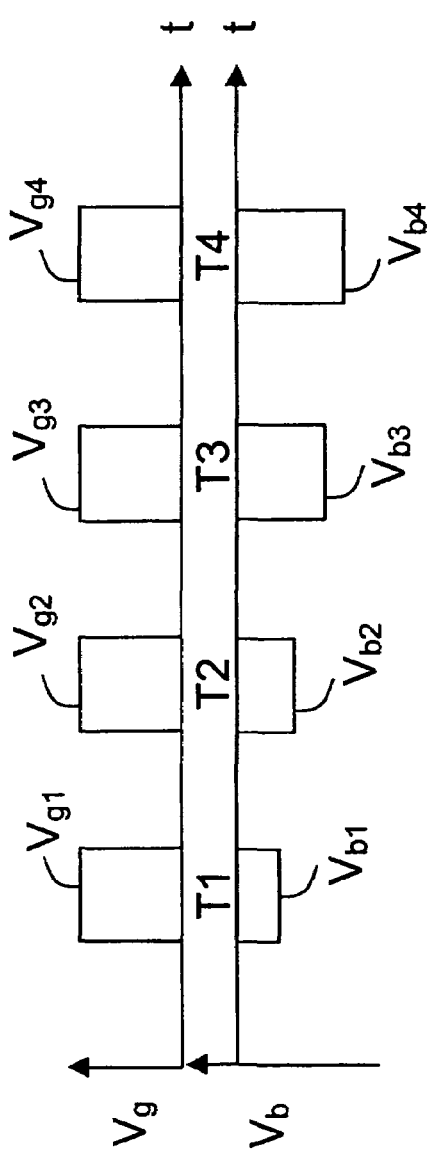

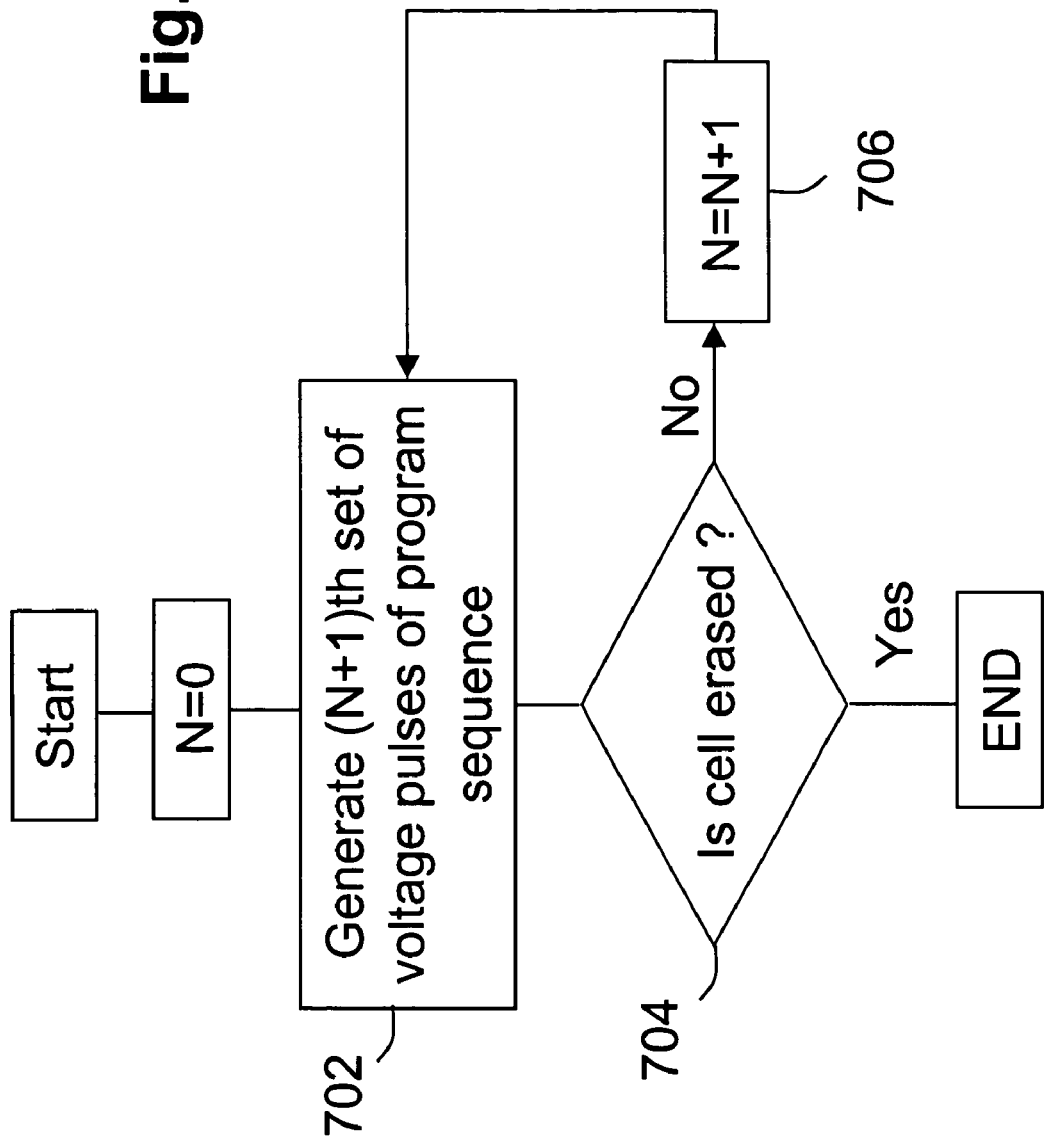

NONVOLATILE SEMICONDUCTOR MEMORY AND OPERATING METHOD OF THE MEMORY

RELATED APPLICATIONS

This application claims priority to and is a continuation-in-part application of U.S. patent application Ser. No. 10/113,356, now U.S. Pat. No. 6,670,601, which has a filing date of Mar. 29, 2002. The above application Ser. No. 10/113,356 is hereby incorporated by reference herein.

FIELD OF THE INVENTION

The invention generally relates to semiconductor memory devices and more particularly to a nonvolatile semiconductor memory cell storing electrons in an erase state, and its operating method.

DESCRIPTION OF THE RELATED ART

Memory devices for nonvolatile storage of information are in widespread use in the art. Exemplary nonvolatile semiconductor memory devices include read only memory (ROM), programmable read only memory (PROM), erasable programmable read only memory (EPROM), electrically erasable programmable read only memory (EEPROM) and flash EEPROM.

Flash EEPROMs are similar to EEPROMs in that memory cells can be programmed (i.e., written) and erased electrically but with the additional capability of erasing all memory cells at once. The widespread use of EEPROM semiconductor memory has prompted much research focusing on developing an EEPROM memory cell with optimal performance characteristics such as shorter programming times, lower voltage usage for programming and reading, longer data retention time, shorter erase time and smaller physical dimensions.

FIG. 1 is a block diagram that illustrates the structure of a prior art nonvolatile memory cell where a nonvolatile memory cell 70 includes an N-channel MOSFET structure. The nonvolatile memory cell 70 includes a P type substrate 706 with two buried N+ junctions, one being the source 700 and the other being the drain 701. A channel 707 is formed between the source 700 and the drain 701. Above the channel is a first isolating layer 703, which generally is a silicon oxide layer. On top of the first isolating layer 703 is a trapping layer 704, which generally is a nitride layer. The trapping layer 704 forms the memory retention layer that traps the hot electrons as they are injected into the nitride layer. A second isolating layer 705, which generally is an oxide layer, is formed to overlay the silicon nitride layer. The silicon oxide layer 705 electrically isolates a conductive gate 702 formed over the second isolating layer 705. The two silicon oxide layers 703 and 705 function as isolation dielectric layers.

This prior art structure can provide a two-bit cell, i.e., the nonvolatile memory cell can store two bits of data. The memory is programmed by channel hot electron injection. By applying programming voltages to the gate 702 and the drain 701 while the source 700 is grounded, electrons can be accelerated sufficiently to be injected into the trapping layer 704 near the drain side 701 so as to increase the energy barrier in the channel 707 near the drain side 701 where a bit of data is stored therein. In addition, electrons can be injected into the trapping layer 704 near the source side 702 to increase the energy barrier in the channel 707 near the source side 701 where another bit of data is stored therein. Provided that the trapping layer 704 includes an appropriate width, the two areas storing electrons in the trapping layer 704 can be identified and used for storing two bits of data.

Regarding the energy barrier of the prior art nonvolatile memory cell, the trapping layer is in a neutral state. When no charge is stored in the trapping layer, the energy barrier in the channel 707 is at a low state. In programming the nonvolatile memory cell, the electrons are injected into the trapping layer near, e.g., the drain 701, so that the energy barrier in the channel 707 near the drain 701 is increased. Moreover, when the electrons are injected into the trapping layer 704 near the source 700, the energy barrier in the channel 707 near the source 700 is increased. The energy barrier in the channel 707 thus includes two high-level sections distributed at two sides of the energy barrier. The threshold voltage of a cell is defined as the gate voltage that is sufficient to invert the channel and cause the current between source and drain. Generally speaking, higher energy barrier in the channel would have a higher threshold voltage while lower energy barrier would have a lower threshold voltage.

Conventional programming using hot electron injection requires high operating voltages and consumes high power. As the size of the nonvolatile cell is reduced and the channel is relatively small, the high operating voltage induces a punch-through effect resulting in high leakage current and low program efficiency. Such becomes a significant design and implementation shortcoming in prior art nonvolatile memory devices serving as two-bit memory cells. Further, the prior art structure requires a particularly confined size, which impedes engineering efforts on size and cost reduction therefor.

Thus, there is a general need in the art for a nonvolatile memory device with an optimal two-bit cell structure, and more particularly, a nonvolatile memory device and associated methods therefor that overcome at least the aforementioned disadvantages of nonvolatile memory devices in the art. In particular, there is a need in the art for a nonvolatile memory device with amplified effects for the trapped electron charges in the trapping dielectric layer and an optimally reduced size.

SUMMARY OF THE INVENTION

The application describes a nonvolatile memory and its operating method. The memory cell comprises a first junction region, a second junction region, a base, a nonconducting charge trapping layer and a gate. In one embodiment, a method of erasing the memory cell comprises performing a processing sequence including applying a voltage bias between the base and the gate to cause electrons to migrate towards and be retained in the trapping layer, and evaluating a read current generated in response to the voltage bias to determine whether a level of gate threshold voltage is reached. The processing sequence is repeated a number of times by varying one or more time the voltage bias between the base and the gate until the level of gate threshold voltage is reached and the memory cell is in an erase state.

In another embodiment, a method of programming the memory cell comprises setting the memory cell to an initial state of a first gate threshold voltage, performing a processing sequence including: applying a voltage bias between the gate and the first junction region to cause electric hole to migrate towards and be retained in the trapping layer, and evaluating a read current generated in response to the voltage bias to determine whether a second gate threshold voltage is reached, wherein the second gate threshold voltage is lower than the first gate threshold voltage. The processing sequence is repeated a number of times by varying one or more time the voltage bias between the gate and the first junction region until the second gate threshold voltage is reached and the memory cell is in a program state.

The foregoing is a summary and shall not be construed to limit the scope of the claims. The operations and structures disclosed herein may be implemented in a number of ways, and such changes and modifications may be made without departing from this invention and its broader aspects. Other aspects, inventive features, and advantages of the invention, as defined solely by the claims, are described in the non-limiting detailed description set forth below.

BRIEF DESCRIPTION OF THE DRAWINGS

FIG. 3 is a schematic view illustrating a further embodiment of the nonvolatile memory cell of the invention with a tunneling layer;

FIGS. 4A–4D are schematic diagrams illustrating a programming method of a nonvolatile memory cell according to various embodiments of the invention;

FIG. 6A illustrates an exemplary energy barrier distribution and voltage distribution for reading one bit near the source as the bit is at low state with the bit near the drain in low and high states;

FIGS. 7A–7C are schematic diagrams illustrating an erase method of a nonvolatile memory cell by substrate injection according to various embodiments of the invention;

FIG. 7G is a flowchart of the general erase method of a nonvolatile memory cell according to an embodiment of the invention.

DETAILED DESCRIPTION OF THE EMBODIMENT(S)

Figure 8:
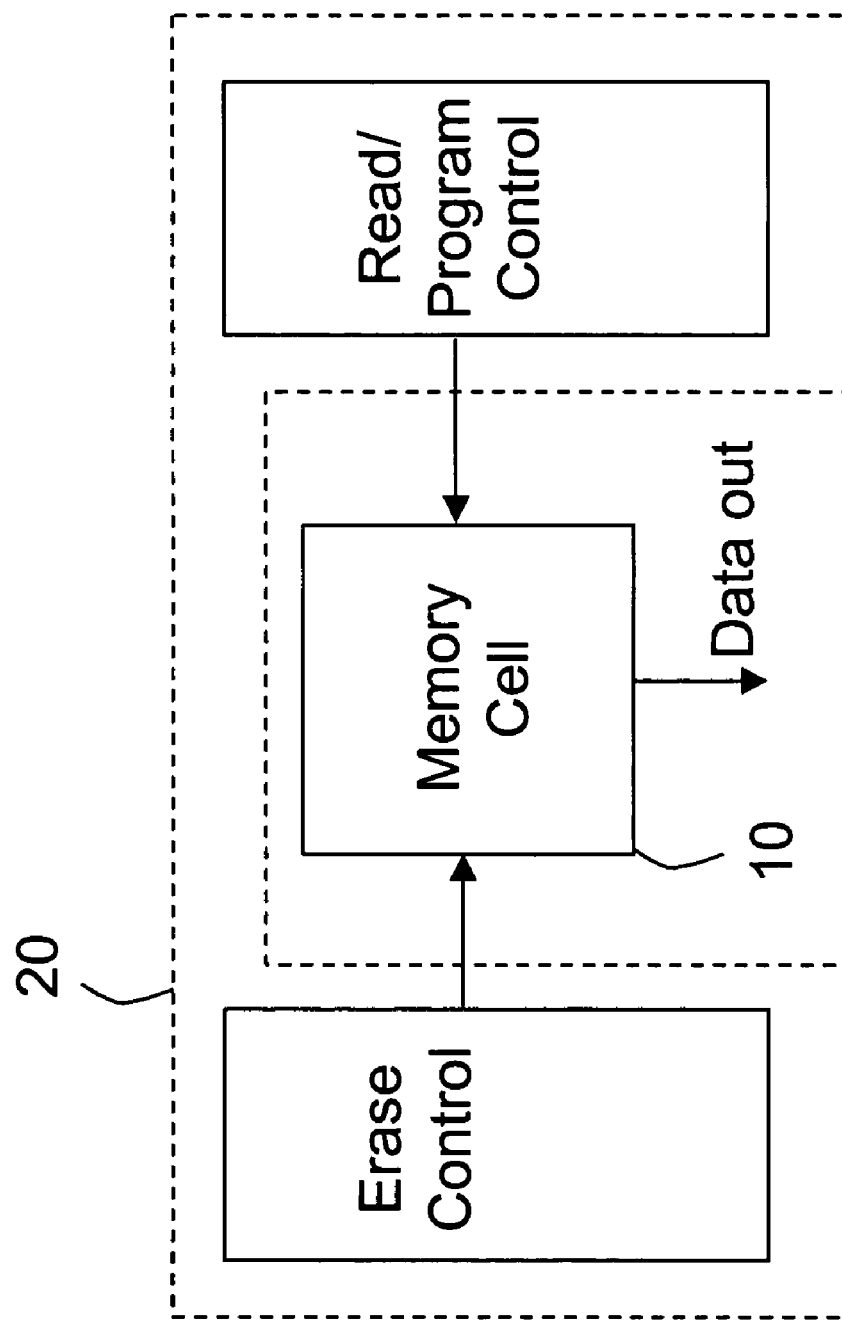
FIG. 8 is a block diagram of a nonvolatile memory according to an embodiment of the invention.

Referring to FIG. 8, a block diagram schematically illustrates a nonvolatile memory according to an embodiment of the invention. The nonvolatile memory comprises one or more memory cell 10 and a memory control circuit 20. The memory control circuit 20 is coupled with the memory cell 10, and is configured to control the operation of the memory cell 10, including erase, program and read operations.

Figure 1:
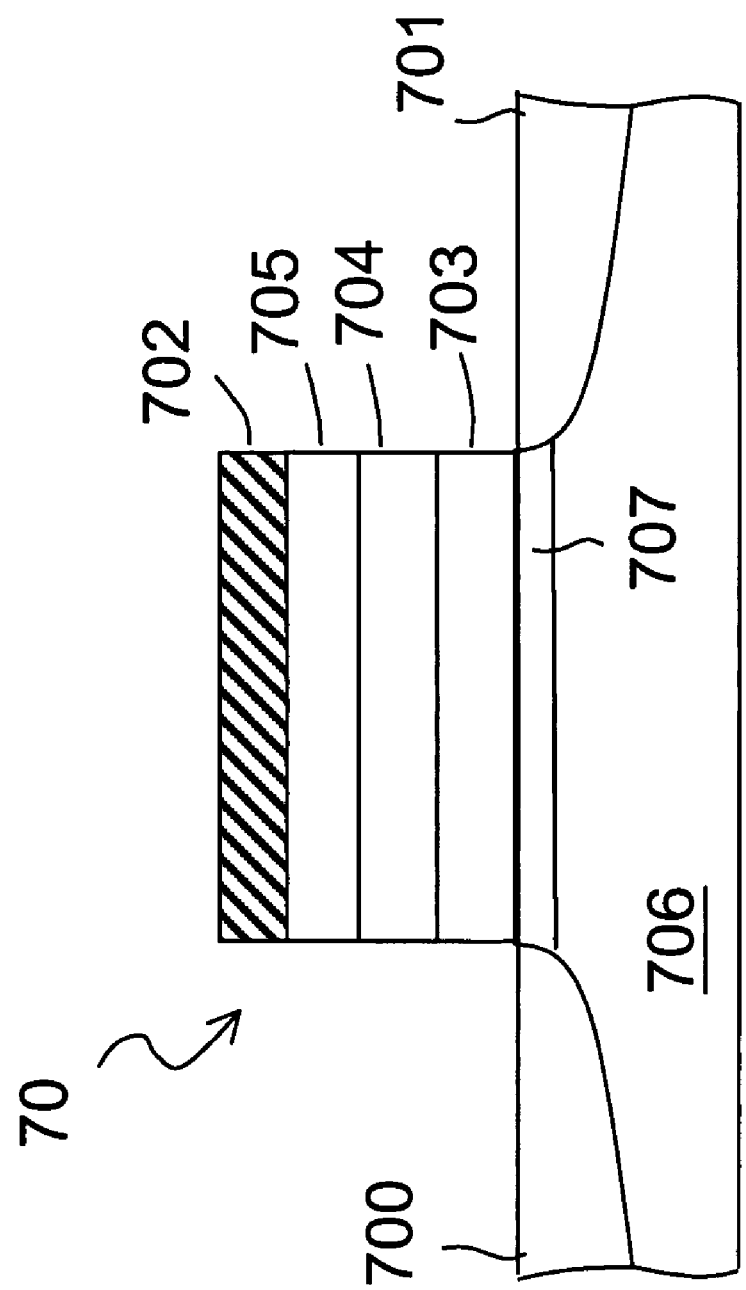
FIG. 1 is schematic view illustrating a nonvolatile memory cell in the prior art.
Figure 2:
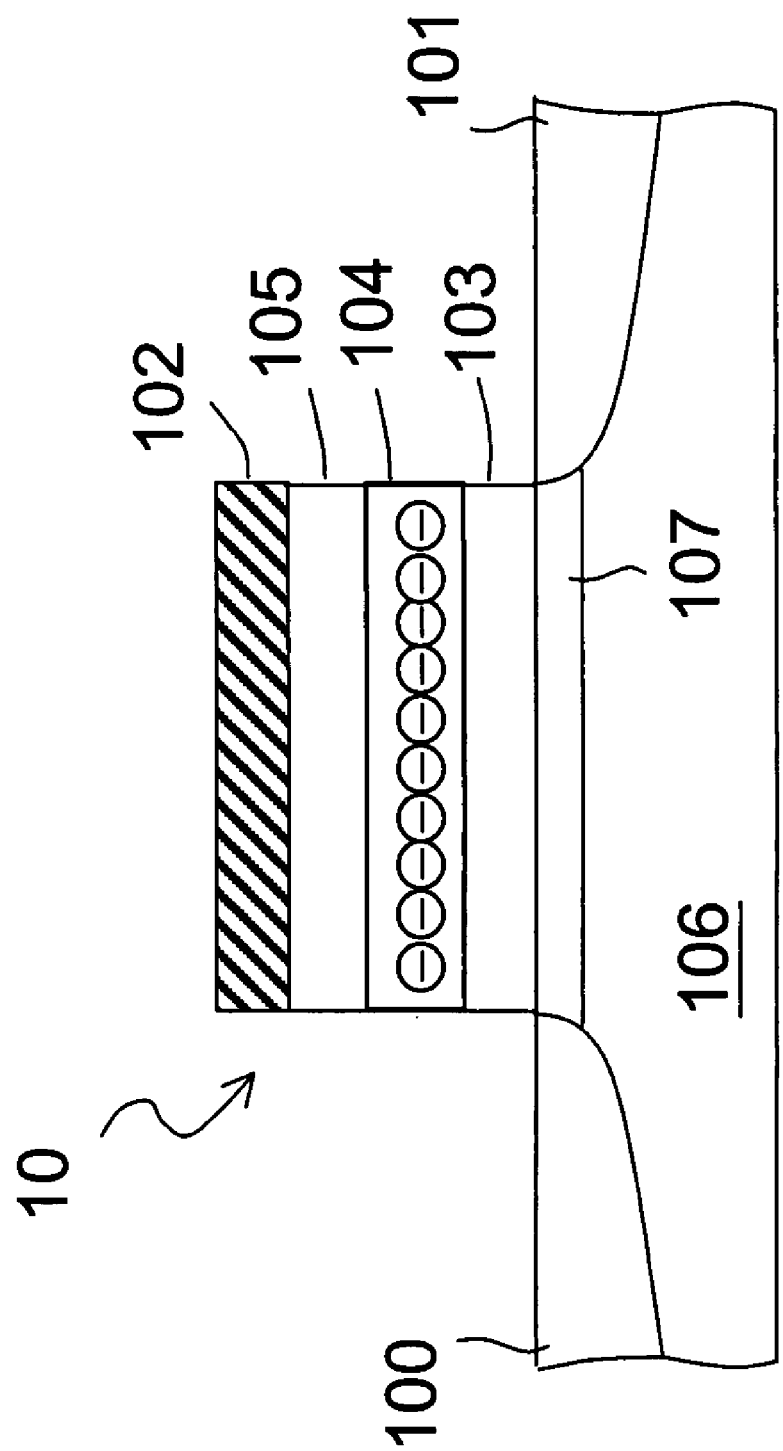
FIG. 2 is a schematic view illustrating a preferred embodiment of the nonvolatile memory cell of the invention.

FIG. 2 is a schematic view of a nonvolatile memory cell 10 implemented according to an embodiment of the invention. The nonvolatile memory cell 10 has an N-channel MOSFET structure. In the nonvolatile memory cell 10, a P-type substrate 106 includes two buried N+ junctions, one being the source 100 and the other being the drain 101. A channel 107 is formed between the source 100 and the drain 101 when a read current occurs between the source 100 and the drain 101. Above the channel is formed a first isolating layer 103, which is a silicon oxide layer. On top of the first isolating layer 103 is a trapping layer 104. The trapping layer 104 is made of a nonconducting material, which can be nitride, $Al_2O_3$ or $HfO_2$. The trapping layer 104 works as a retention layer for trapping electrons being injected therein. A second isolating layer 105, made of silicon oxide, is formed to overlay the silicon nitride layer. The silicon oxide layer 105 operates to electrically isolate a conductive gate 102 formed over the second isolating layer 105. The two silicon oxide layers 103, 105 act as isolation dielectric layers.

According to an embodiment of the invention, electrons are stored in the trapping layer 104 in an erase state of the memory cell 10 so that the energy level in the channel is at a high state. To program the memory cell 10, hot electric holes are injected into the trapping layer 104 from the source 100 or the drain 101 so as to change the energy barrier.

In operating the nonvolatile memory cell, it may be desirable to inject electric holes or electrons into the trapping layer 104 at high speed. It may be further desirable to retain the electrons or electric holes in the trapping layer when the nonvolatile memory cell is not operational. According to a particular embodiment, the energy barrier of an isolation layer (such as the first isolating layer 103) can be 3.2 eV for electrons and 4.9 eV for the electric holes. Such has a generally equal effect on the electrons and electric holes drawn out of the trapping layer 104 and electrons and holes injected into the trapping layer 104 through the first isolating layer 103. It may be further desirable to steadily retain the electrons or electric holes in the trapping layers 104 when the nonvolatile memory cell is not operational. Conversely, when the nonvolatile memory cell is operational, the electrons and electric holes are readily injected into the trapping layer 104. That is, the electrons and electric holes travel through an isolation layer with lower energy barriers so as to speed up the operation of the nonvolatile memory cell.

FIG. 3 is a schematic view illustrating a nonvolatile memory cell implemented according to another embodiment of the invention. In this variant embodiment, a tunnel layer 200 is placed between the channel 107 and the first isolating layer 103. The material of the tunnel layer 200 is particularly selected to provide lower energy barriers to the electrons and electric holes than those of the first isolating layer 103 where the electrons and electric holes are readily injected into the trapping layer and thus the speed in charge storing in the trapping layer 104 is accordingly increased. Since the first isolating layer 103 remains next to the trapping layer 104, the electrons or electric holes in the trapping layer 104 are retained therein as well. According to a particular embodiment of the invention, materials for the tunnel layer 200 can be selected from tantalum oxide or BST (i.e., a compound of barium, strontium, and tantalum).

According to an embodiment, electrons are stored in the trapping layer 104 in an erase state of the memory cell, while hot electric holes are injected in the trapping layer 104 when the memory cell is programmed. The memory cell thereby has a threshold voltage in the erase state which is higher than its threshold voltage in the program state.

Figure 4A:
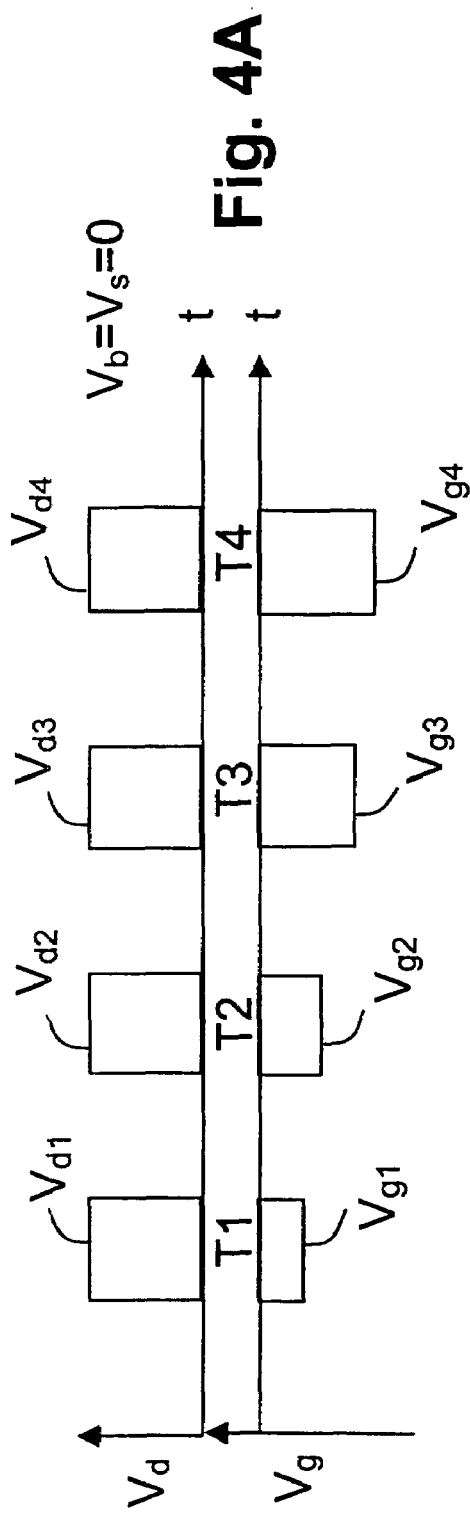

FIG. 4A–4B are schematic diagrams illustrating a programming operation of the memory cell according to an embodiment of the invention. Before programming, the memory cell 10 is in an erased state in which the trapping layer 104 stores electrons and have a net negative charge. To program the memory cell, the base (i.e. substrate) 106 and the source 100 of the memory cell are grounded or have potential $V_b = V_s = 0$ V. Meanwhile, varying voltage biases are applied to the memory cell via synchronously applying a sequence of voltage pulses $V_d$ and $V_g$ to the drain 101 and the gate 102, respectively.

As shown in the example of FIG. 4A, at a time T1 of the sequence, a positive voltage pulse $V_{d1}$ is applied to the drain 101 while a negative voltage pulse $V_{g1}$ is applied to the gate 102 of the memory cell. For example, $V_{d1} = +5V$ and $V_{g1} = -2V$. Under this voltage bias between the drain 101 and the gate 102, electric holes migrate from the drain 101 towards the trapping layer 104, as illustrated in FIG. 4B. The electric holes thereby are trapped and stored in a local area of the trapping layer 104 near the drain 101, thereby programming a drain or right bit ("bit-R"). The programming of the drain bit creates a lower gate threshold voltage only through the local trapping region of the trapping layer 104 near the drain side 101.

After application of the voltage pulses $V_{d1}$, $V_{g1}$ at time T1, the memory cell is read to determine whether it has been effectively programmed. This verification can include detecting and comparing a generated read current with a predetermined value; if the read current differs from the predetermined value, it means that the cell has not been programmed. In an example, the read current can be generated via applying positive voltages to the source 100 and gate 102 while grounding the drain 101.

If the memory cell is not in a program state, voltage pulses $V_{d2}$, $V_{g2}$ are respectively applied to the drain 101 and the gate 102 at a subsequent time T2 to generate electric hole migration towards the trapping layer 104. The negative voltage pulse $V_{g2}$ has a greater magnitude than $V_{g1}$ to achieve a deeper programming while the drain voltage pulse remains at a same level $V_{d2} = V_{d1}$. For example, the gate voltage pulse can be $V_{g2} = -2.5V$. The alternation of pulse programming and reading cycles is repeated a number of times (T3, T4, etc.) until the memory cell is effectively programmed.

In the embodiment of FIG. 4A, the gate voltage pulses $V_g$ can be ramped in a manner that the magnitude of each successive pulses increases by a constant amount, for example 0.5V. It is also understood that $V_g$ can be successively applied with unequal magnitudes varying according to any schemes.

Figure 4C:
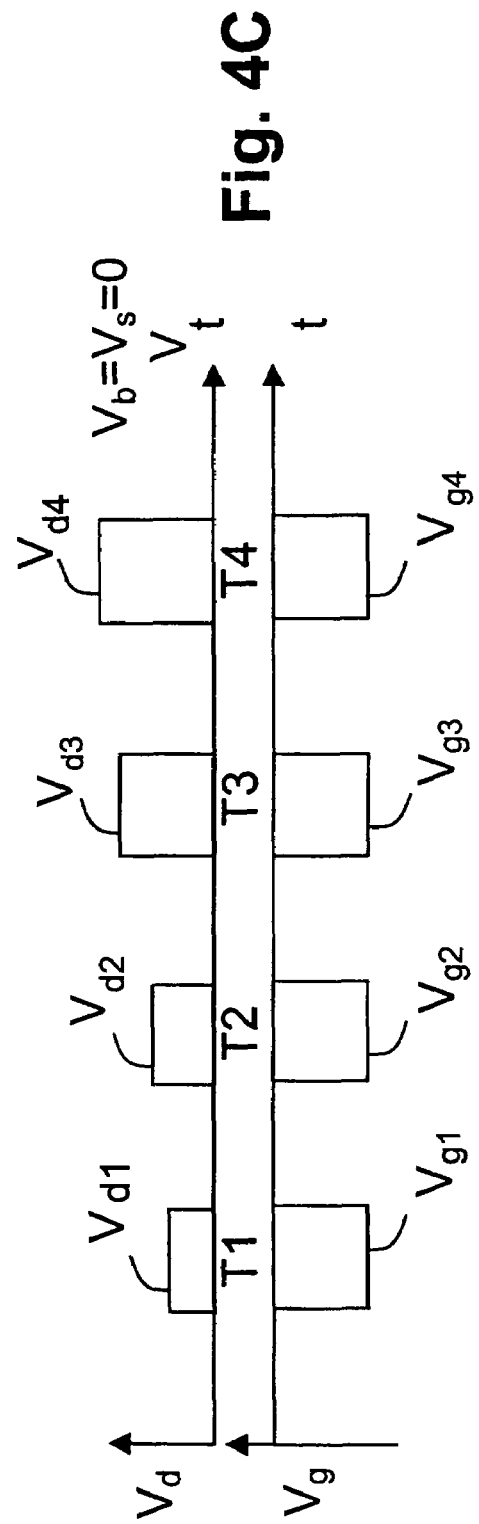

FIG. 4C is a schematic diagram illustrating a variant embodiment implemented to program the memory cell. This variant embodiment differs from the previous one of FIG. 4A in that the drain 101 receives the application of a ramp of positive voltage pulses $V_d$ while the gate is synchronously applied with negative voltage pulses $V_g$ of a constant magnitude. The ramp of positive voltage pulses $V_d$ can be increasing from an initial level of +3.5V while the magnitude of the negative voltage pulses Vg is set to a constant level of –5V. Varying voltage biases thereby are generated to cause electric hole migration from the drain 101 to an area of the trapping layer 104 near the drain side 101 to program a drain bit.

Figure 4D:
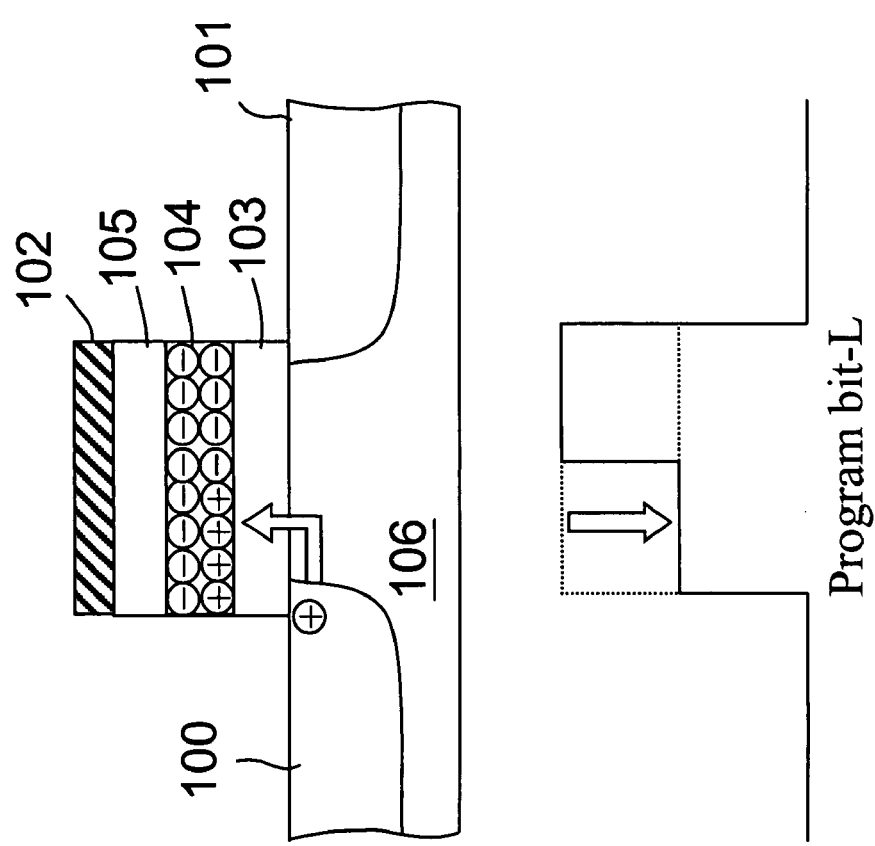

Similarly, one bit can be programmed from the source side 100 by applying to the source 100 a sequence of voltage pulses similar to that applied for programming a drain bit. As shown in FIG. 4D, the programming of a source or left bit ("bit-L") creates a lower gate threshold voltage only through the local trapping region of the trapping layer 104 near the source side 100.

Figure 4E:
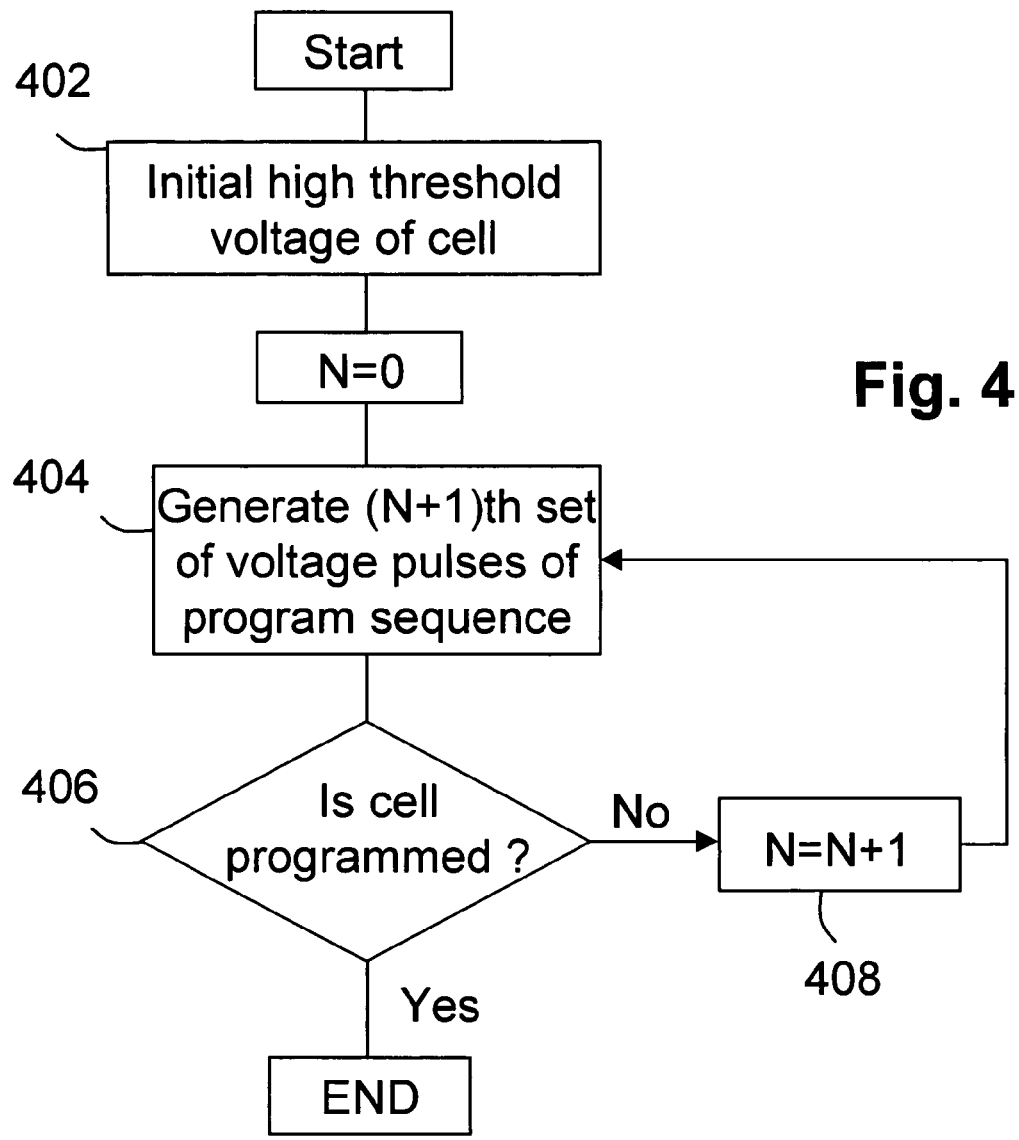
FIG. 4E is a flowchart of the general programming method of a nonvolatile memory cell according to an embodiment of the invention.

FIG. 4E is a flowchart of the general method of programming a memory cell according to an embodiment of the invention. Before programming, the memory cell is in a state of high gate threshold voltage, i.e. where the trapping layer 104 retains a net negative charge therein (402). A set of voltage pulses then is applied to the drain (or source) and the gate to program the memory cell (404). The memory cell then is tested to determine whether it is effectively programmed (406). If it has not been programmed, programming voltage pulses are applied again, and the processing sequence of (404, 406) is repeated a number of times (408) until the memory cell is effectively programmed.

Figure 5A:
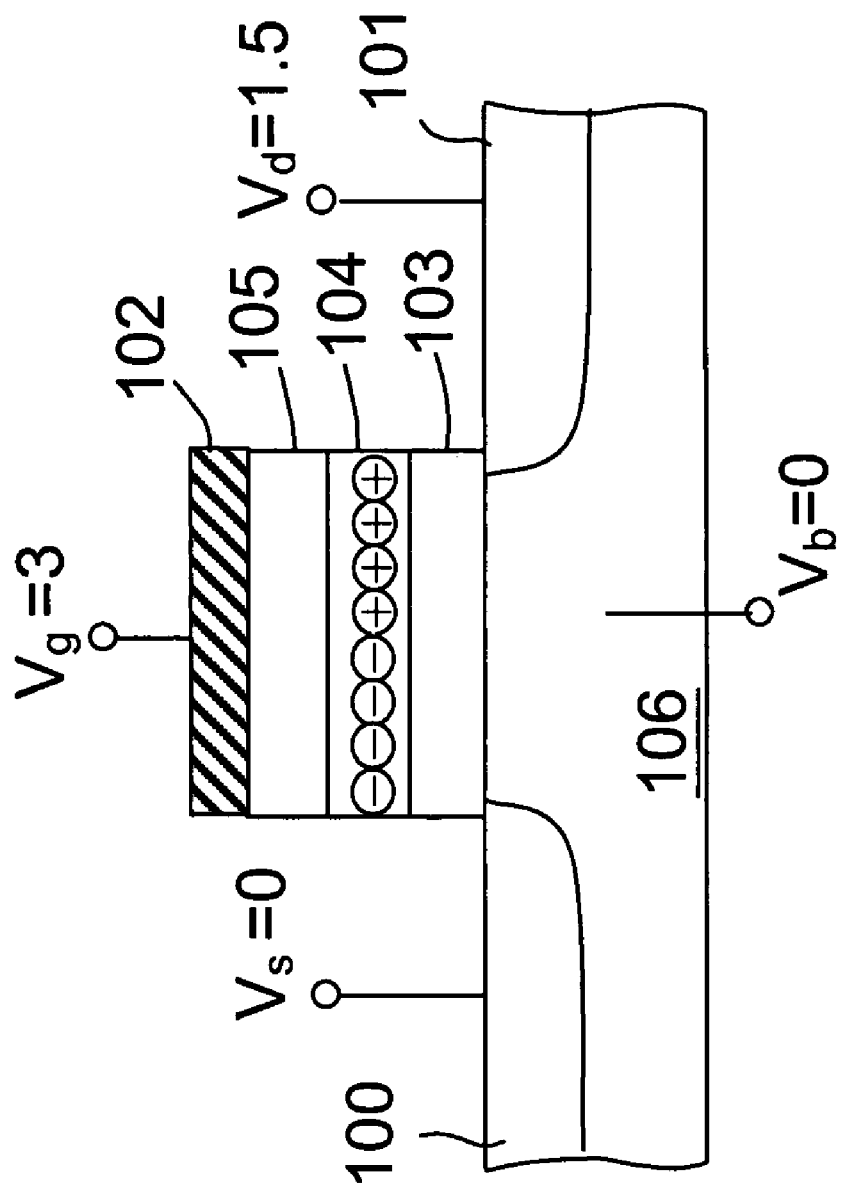
FIGS. 5A and 5B are schematic views respectively illustrating an exemplary operation of reading the source bit and drain bit of the nonvolatile memory cell according to another embodiment of the invention.
Figure 6B:
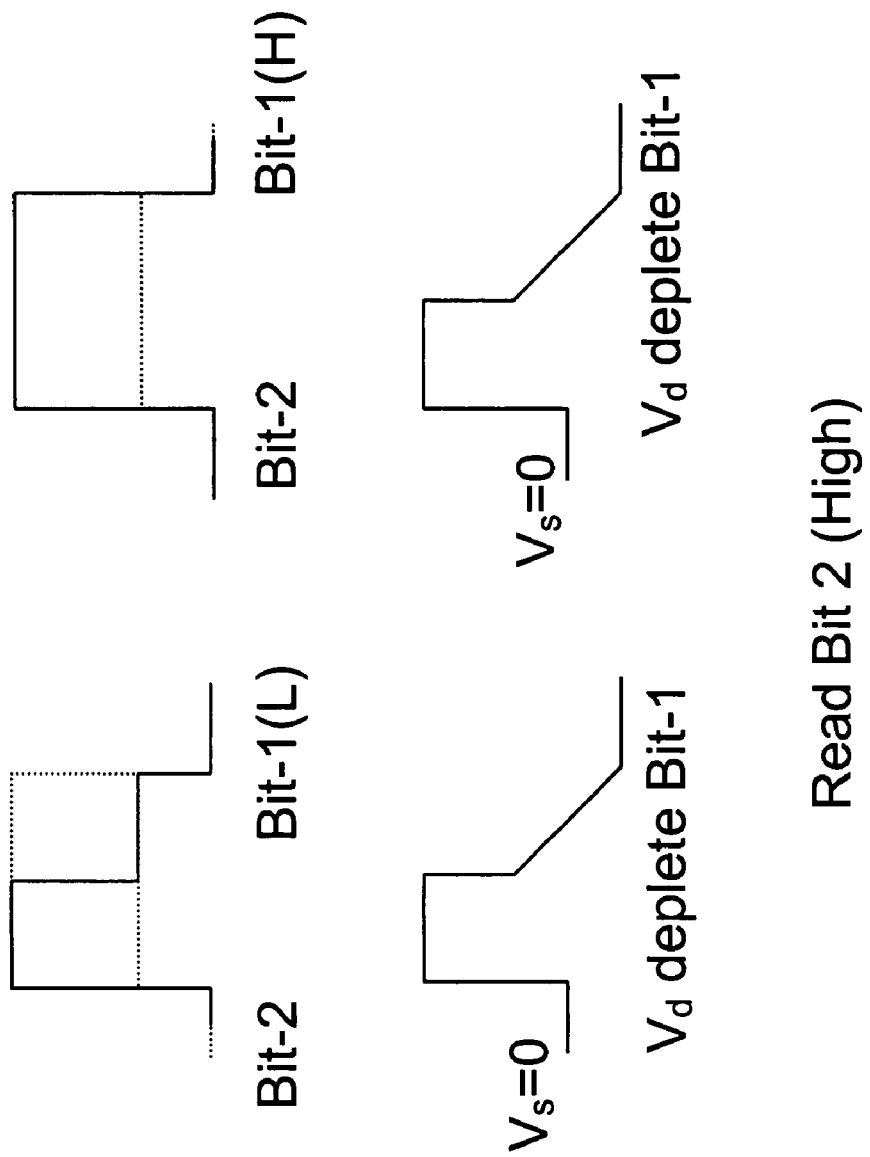
FIG. 6B illustrates an exemplary energy barrier distribution and voltage distribution for reading one bit near the source as the bit is at a high state with the bit near the drain in low and high states.

FIG. 5A is a schematic view illustrating an exemplary reading operation of the source bit of the memory cell according to an embodiment of the invention. If it is desired to read a bit stored in the trapping layer near the source 100, the memory control circuit 20 applies a positive voltage to the gate 102 and the drain 101 while the source 100 is grounded. The lower limit for the positive voltage applied to the gate 102 is the voltage at which sufficient inversion is generated in the channel 107 whereby the programmed state can be sensed. The positive voltage applied to the drain 101 reduces the energy barrier and potential across the bit stored near the drain 101, resulting in the channel current. FIG. 6A illustrates the energy barrier distribution and voltage distribution for reading the bit near the source as it is at low state with the bit near the drain in low and high states. FIG. 6B illustrates the energy barrier distribution and voltage distribution for reading the bit near the source as it is at a high state with the bit near the drain in low and high states. Similar to the programming operation, a plurality of bits can be read in parallel by the memory control circuit 20.

Figure 5B:
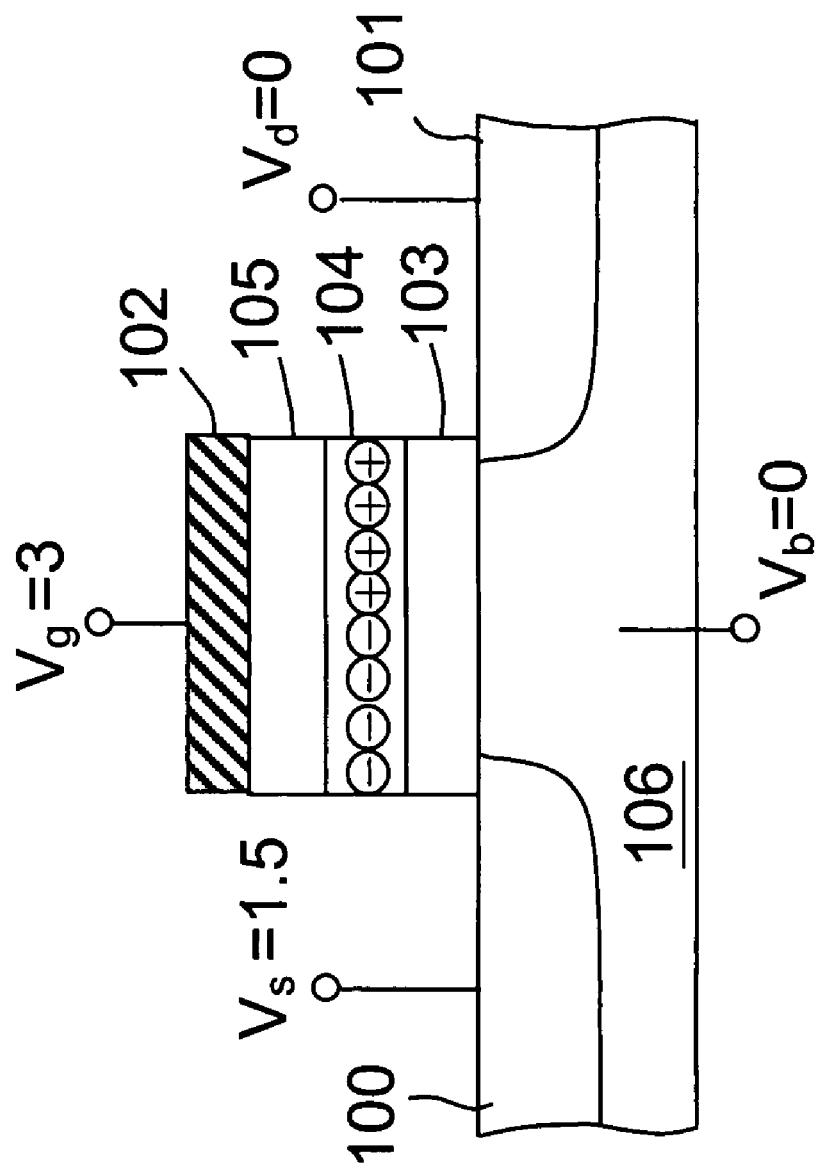
Figure 6C:
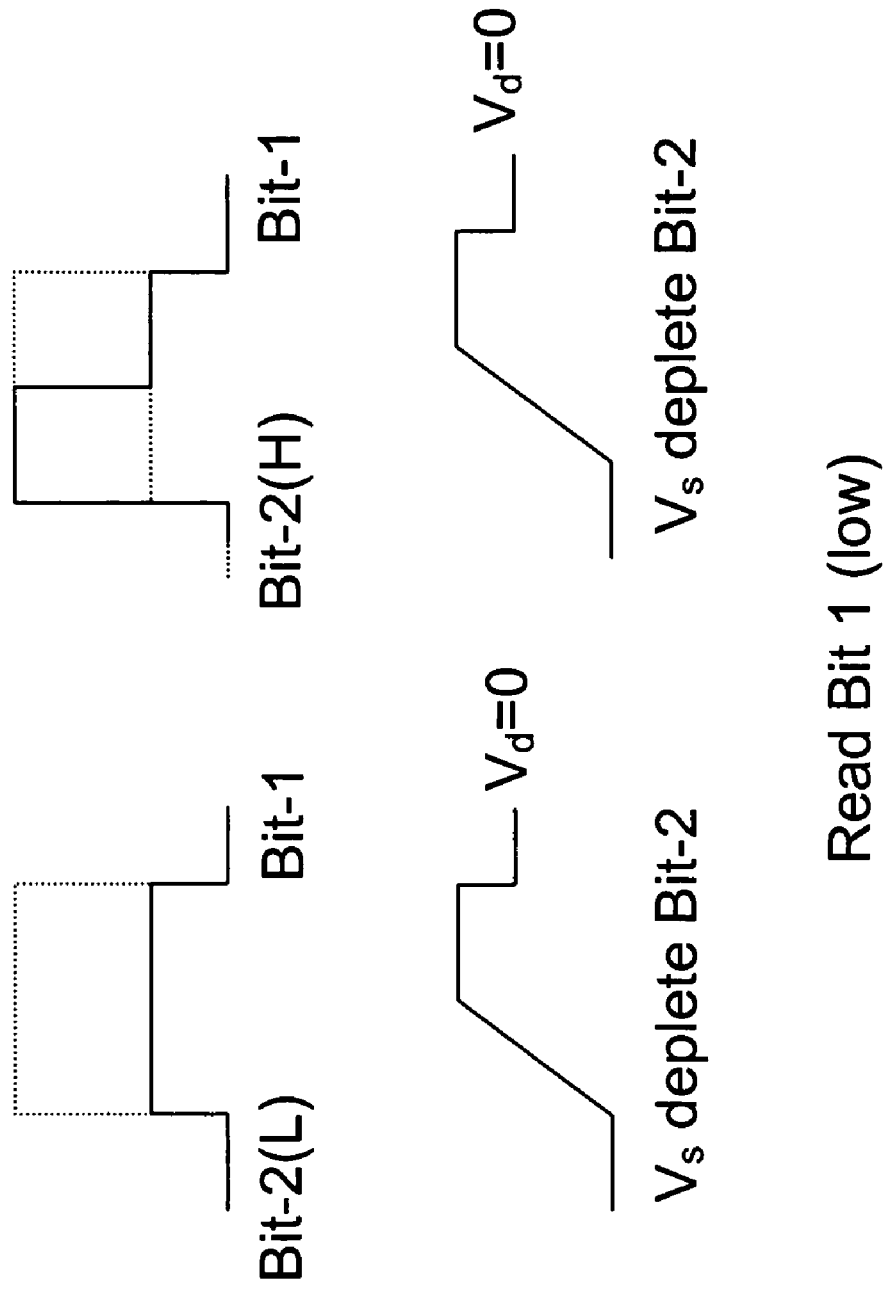
FIG. 6C illustrates an exemplary energy barrier distribution and voltage distribution for reading one bit near the drain as the bit is at low state with the bit near the drain in low and high states.
Figure 6D:
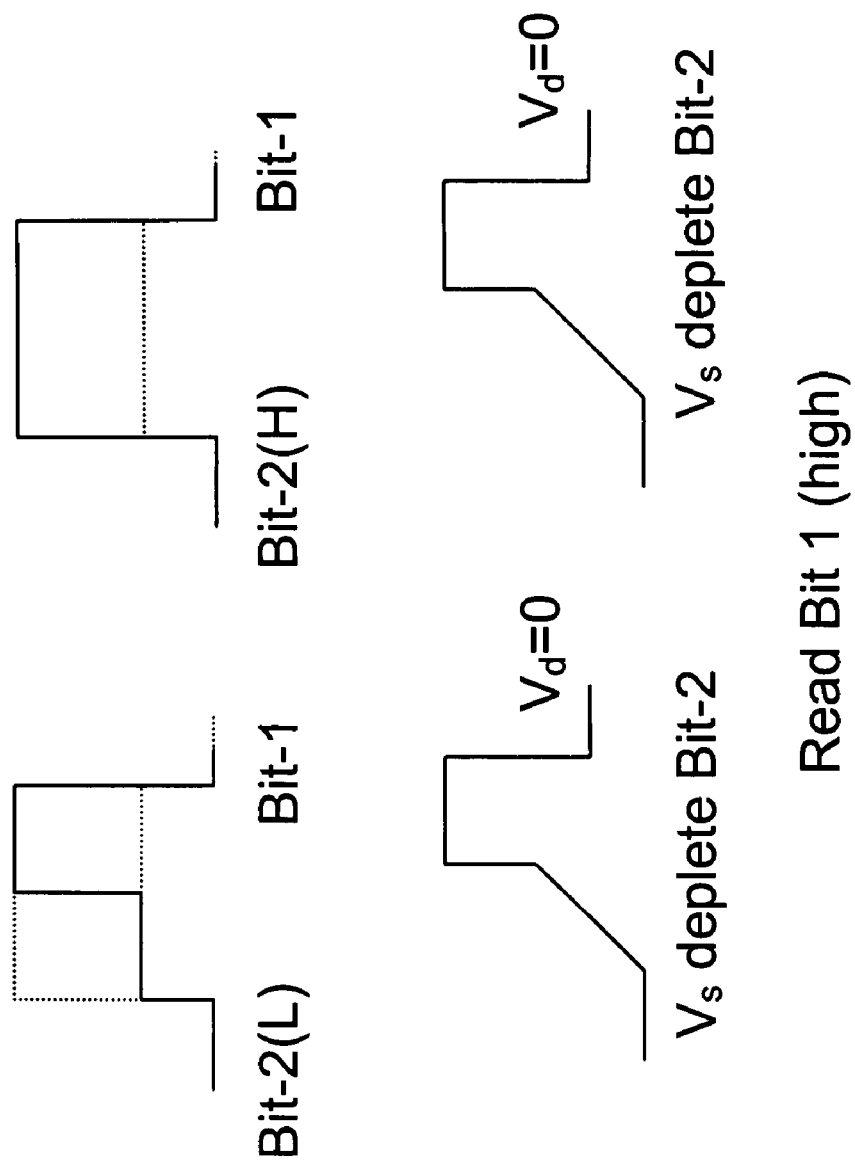
FIG. 6D illustrates an exemplary energy barrier distribution and voltage distribution for reading one bit near the drain as the bit is at a high state with the bit near the drain in low and high states.

When the bit in the trapping layer 104 near the drain is read, as illustrated in FIG. 5B, a positive voltage is applied to the gate 102 and source 100 while the drain 101 is grounded. The lower limit for the positive voltage applied to the gate 102 is the voltage at which sufficient inversion is generated in the channel 107 whereby the programmed state can be sensed. The positive voltage applied to the source 100 reduces the energy barrier and potential across the bit stored near the source 100, resulting in the channel current. FIG. 6C illustrates the energy barrier distribution and voltage distribution for reading the bit near the drain as it is in a low state with the bit near the drain in both low and high states. FIG. 6D illustrates the energy barrier distribution and voltage distribution for reading the bit near the drain as it is in a high state with the bit near the drain in both low and high states.

Figure 7B:
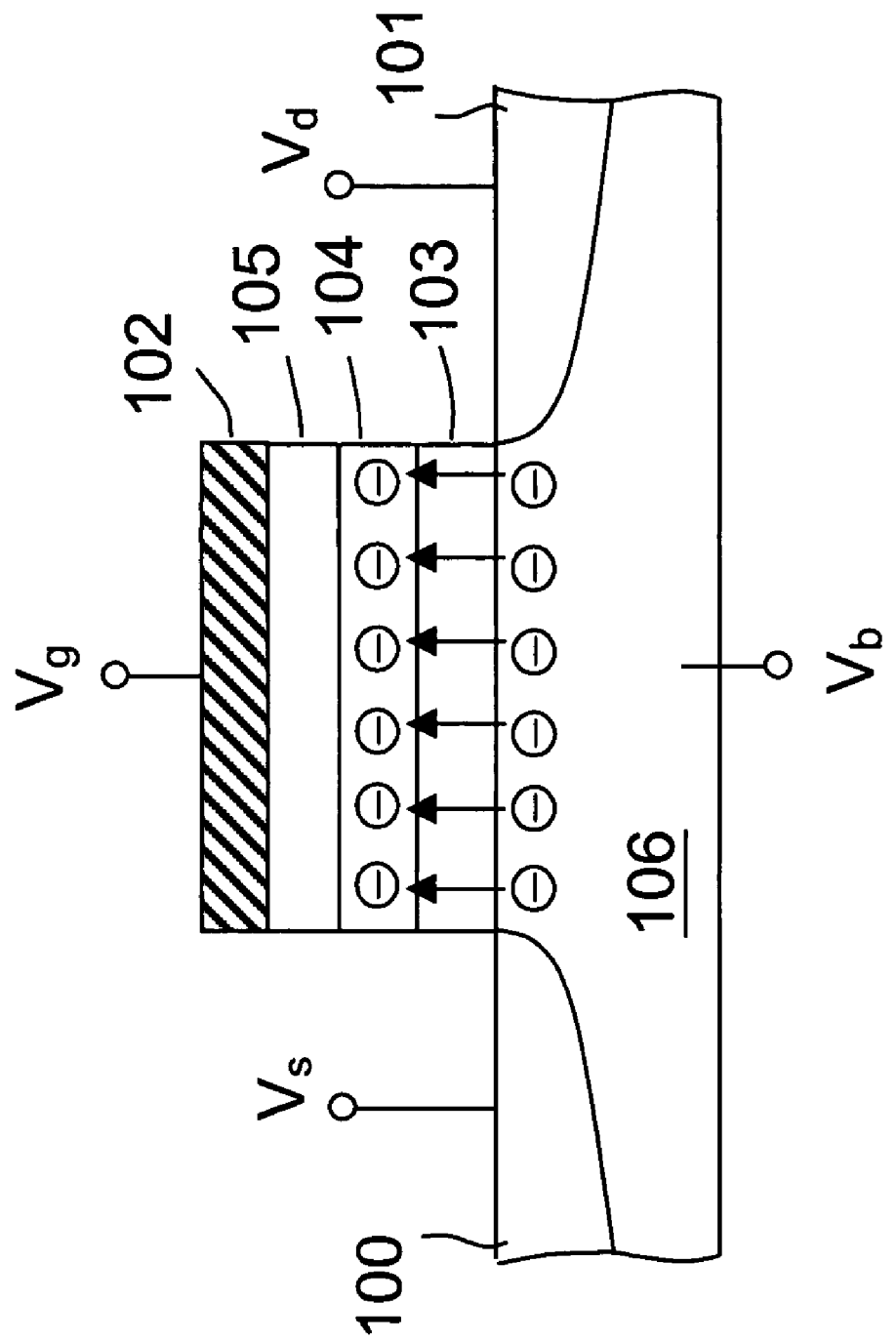

Now reference is made to FIG. 7A–7B to illustrate an erasure operation according to an embodiment of the invention. In this embodiment, uniform electron injection by Fowler-Nordheim tunneling through the channel is implemented to erase the memory cell 10. In the erasure operation, the source 100 and the drain 101 of the memory cell are floated or, alternatively, can have a voltage equal to Vb.

Meanwhile, a sequence of voltage pulses $V_g$ and $V_b$ is synchronously applied to the gate 102 and the base (i.e. substrate) 106.

As shown in FIG. 7A, at time T1 of the erasure sequence, a positive voltage pulse $V_{g1}$ is applied to the gate 102 while a negative voltage pulse $V_{b1}$ is applied to the substrate 106 of the memory cell. In an example of implementation, $V_{g1}=+4V$ and $V_{b1}=-10V$. Under this voltage bias, electron tunneling occurs from the substrate 106 towards the trapping layer 104, as illustrated in FIG. 7B. The electrons are thereby stored and retained in the trapping layer 104.

After application at T1 of the voltage pulses $V_{g1}$, $V_{b1}$, the memory cell is read to determine whether it has been effectively erased. This verification can include detecting and comparing a generated read current with a predetermined value; if the read current differs from the predetermined value, it means that the cell is not erased. If the memory cell is not in the erasure state, voltage pulses $V_{g2}$, $V_{b2}$ are respectively applied to the gate 102 and the substrate 106 at a time T2 to generate electron tunneling towards the trapping layer 104. The positive voltage pulse $V_{g2}$ has a greater magnitude than $V_{g1}$ and can be, for example, $V_{g2}=-2.5V$, while the negative voltage pulse $V_{b2}=V_{b1}$ remains at a same level. This sequence of pulse erasure and reading cycles, with negative $V_b$ kept unchanged while the magnitude of negative $V_g$ progressively increasing so as to perform a deeper erasure each time, can be repeated a number of times (T3, T4, etc.) until the memory cell is effectively erased.

In the embodiment of FIG. 7A, the gate voltage pulses $V_g$ can be ramped in a manner that the magnitude of each successive pulses increases by a constant amount, for example 0.5V. It is also understood that $V_g$ can be successively applied with unequal magnitudes varying according to any schemes.

FIG. 7C illustrates a variant embodiment of memory cell erasure by Fowler-Nordheim tunneling through the substrate according to the invention. This variant embodiment differs from the previous one of FIG. 7A in that the substrate 106 receives the application of a ramp of negative voltage pulses $V_b$ while the gate is synchronously applied with positive voltage pulses $V_g$ of a constant magnitude. The ramp of negative voltage pulses $V_b$ can be decreasing from an initial level of −4V while the magnitude of the positive voltage pulses $V_g$ is set to a constant level of +10V in the erasure sequence.

Figure 7D:
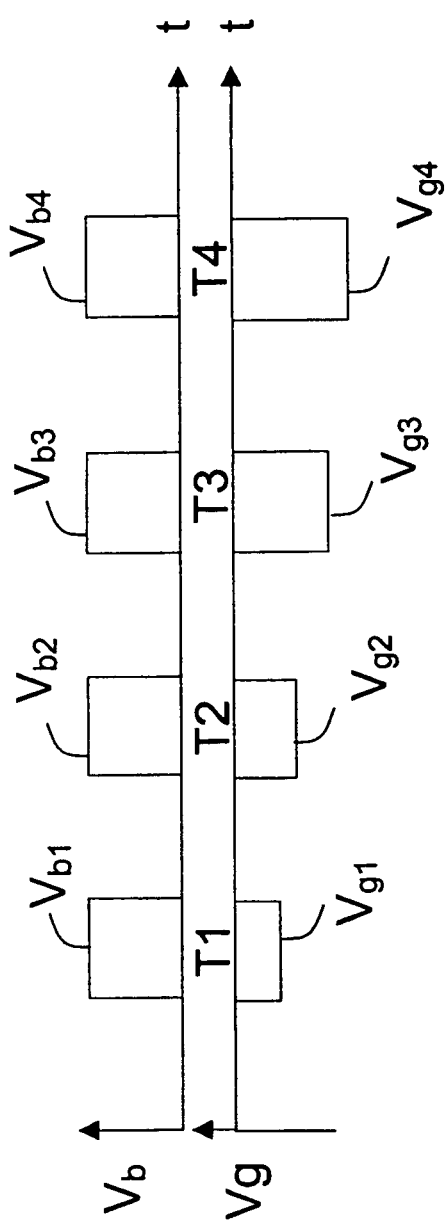
FIGS. 7D–7F are schematic diagrams illustrating an erase method of a nonvolatile memory cell by gate injection according to various embodiments of the invention.

Notwithstanding the foregoing, other methods can be alternatively implemented to erase the memory cell. FIG. 7D–7E are schematic diagrams illustrating an erasure method by gate injection according to another embodiment of the invention. In this embodiment, the source and drain are floated or, alternatively, can have a voltage equal to $V_b$. Meanwhile, a sequence of voltage pulses $V_g$, $V_b$ alternated with verification steps are applied to the gate 102 and the substrate 106 until the memory cell is effectively erased. In this erasure scheme, the gate 102 receives the application of a ramp of negative voltage pulses Vg with increasing magnitude while the substrate 106 is synchronously applied with positive voltage pulses Vb of a same magnitude.

At each time (T1, T2, etc.) of the erasure sequence, the applications of a negative voltage pulse Vg to the gate 102 and a positive voltage pulse Vb to the substrate 106 creates a voltage bias causing a movement of electrons from the gate 102 towards the trapping layer 104, as illustrated in FIG. 7E. Electrons are thereby stored and retained in the trapping layer 104 in the erase state, which generates a high gate threshold voltage.

Figure 7F:
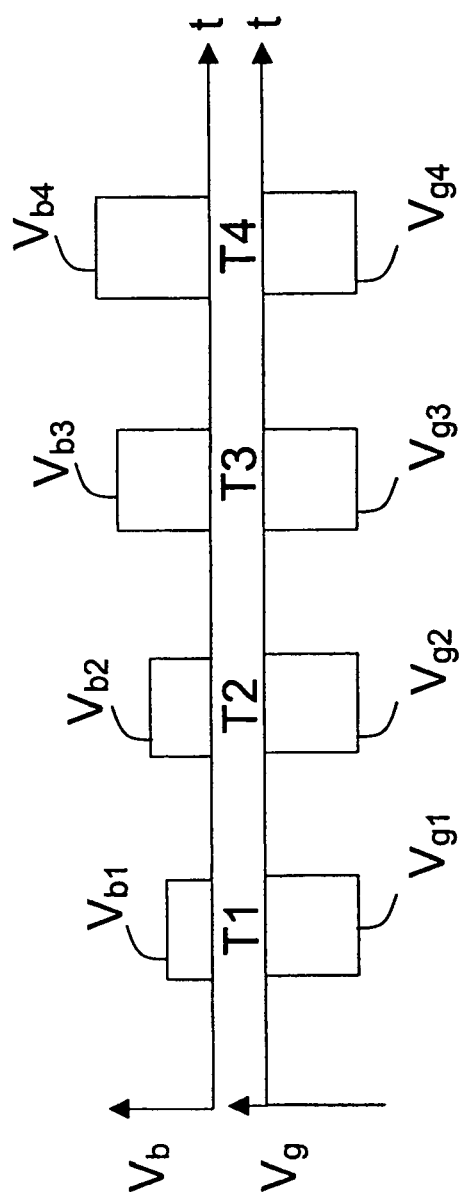
Figure 7E:
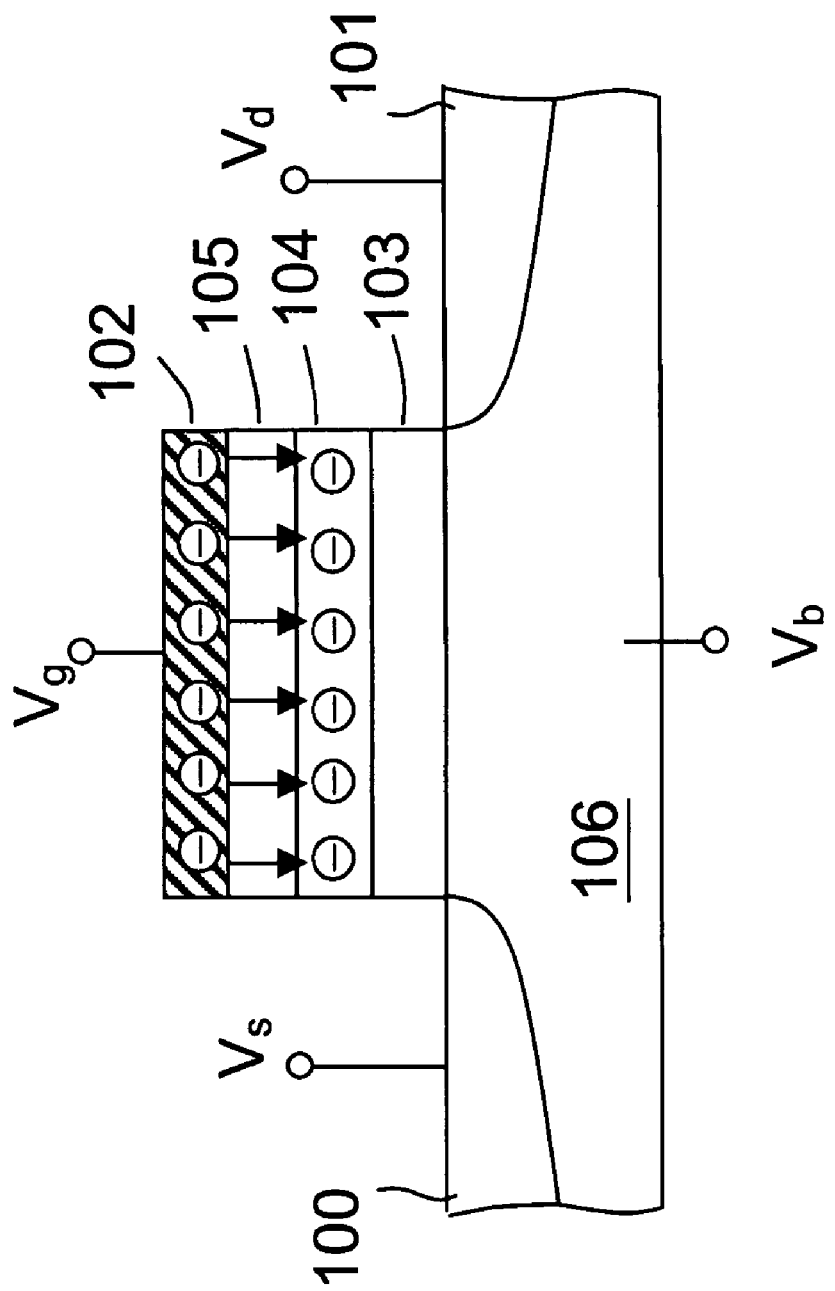

As shown in the variant example of FIG. 7F, the variation of magnitude can be interchangeably applied to the positive voltage pulses Vb while the magnitude of the negative voltage pulses Vg is unchanged to similarly perform the memory cell erasure by gate injection.

FIG. 7G is a flowchart of the general method of erasing a memory cell according to an embodiment of the invention. A set of voltage pulses is applied to the drain (or source) and the gate to erase the memory cell (802). The memory cell then is tested to determine whether it is effectively erased (804). If it has not been erased, erasing voltage pulses are applied again, and the processing sequence of 802, 804 is repeated a number of times (806) until the memory cell is effectively erased.

For programming the nonvolatile memory in accordance with the invention, the channel is turned off. As a result, no current will flow from the drain 101 to the source 100, or along a reverse path. Thus, the invention advantageously prevents the occurrence of punch-through effects causing large leakage current, high power consumption and low programming efficiency, and the two bits in the memory cell can be well identified. For the erase operation, electrons are stored in the trapping layer where the energy barrier in the channel is increased. The level of the energy barrier in the channel is uniformly distributed in the regions covering the two bits, a bit 1 and a bit 2, in the nonvolatile memory cell. As bit 1 is programmed, the energy barrier on the side of bit 1 is lowered by depleting the trapped electrons or by injecting hot holes, compensating and recombining the amount of carriers in the trapping layer. As bit 2 is programmed, the energy barrier in the side of bit 2 is lowered by depleting the trapped electrons or by injecting hot holes, compensating and recombining the amount of carriers in the trapping layer. When the bits 1 and 2 are programmed, both energy barriers of bit 1 and bit 2 are lowered. Since the voltage from the gate will cut off the channel, no current will punch through the channel. Current paths are only formed between the drain and the trapping layer or between the source and the trapping layer. When the bits 1 and 2 in the trapping layer are very close (e.g., adjacent to one another), there is advantageously no resolution reduction for identifying the two bits.

In above embodiment, the method for programming the memory cell is by injecting electric holes to the trapping layer. As electric holes are injected into the trapping layer, it has the effect of reducing the net charges in the trapping layer of the memory cell. Drawing electrons out of the trapping layers also achieve substantially the same result. Thus, the method of drawing electrons out of the trapping layer to achieve the object of programming the nonvolatile memory cells is also within the scope of the present invention.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Additionally, structures and functionality presented as discrete components in the exemplary configurations may be implemented as a combined structure or component. These and other variations, modifications, additions, and improvements may fall within the scope of the invention as defined in the claims that follow.

What is claimed is:

1. A method of operating a memory cell that comprises a first junction region, a second junction region, a base, a nonconducting charge trapping layer and a gate, the method comprising:
    performing a processing sequence including:
    applying a voltage bias between the base and the gate to cause electrons to migrate towards and be retained in the trapping layer;
    evaluating a read current generated in response to the voltage bias to determine whether a level of gate threshold voltage is reached; and
    repeating the processing sequence a number of times by varying one or more time the voltage bias between the base and the gate until the level of gate threshold voltage is reached and the memory cell is in an erase state.

2. The method of claim 1, wherein applying a voltage bias between the base and the gate comprises applying a positive voltage to the gate and a negative voltage to the base.

3. The method of claim 1, wherein applying a voltage bias between the base and the gate comprises applying a positive voltage to the base and a negative voltage to the gate.

4. The method of claim 1, wherein repeating the processing sequence a number of times by varying one or more time the voltage bias between the base and the gate comprises repeating the processing sequence by applying voltage pulses of unequal magnitudes to the base.

5. The method of claim 4, wherein repeating the processing sequence a number of times by varying one or more time the voltage bias between the base and the gate further comprises repeating the processing sequence by applying voltage pulses of a constant magnitude to the gate.

6. The method of claim 1, wherein repeating the processing sequence a number of times by varying one or more time the voltage bias between the base and the gate comprises repeating the processing sequence by applying ramped voltage pulses to the base.

7. The method of claim 6, wherein repeating the processing sequence a number of times by varying one or more time the voltage bias between the base and the gate further comprises repeating the processing sequence by applying voltage pulses of a constant magnitude to the gate.

8. The method of claim 1, wherein repeating the processing sequence a number of times by varying one or more time the voltage bias between the base and the gate comprises repeating the processing sequence by applying voltage pulses of unequal magnitudes to the gate.

9. The method of claim 8, wherein repeating the processing sequence a number of times by varying one or more time the voltage bias between the base and the gate further comprises repeating the processing sequence by applying voltage pulses of a constant magnitude to the base.

10. The method of claim 1, wherein repeating the processing sequence a number of times by varying one or more time the voltage bias between the base and the gate comprises repeating the processing sequence by applying ramped voltage pulses to the gate.

11. The method of claim 10, wherein repeating the processing sequence a number of times by varying one or more time the voltage bias between the base and the gate further comprises repeating the processing sequence by applying voltage pulses of a constant magnitude to the base.

12. The method of claim 1, wherein evaluating a read current generated in response to the voltage bias comprises applying positive voltages respectively to the gate and one of the first or second junction region while grounding the other of the first or second junction region, thereby creating the read current; and
    comparing the generated current with a predetermined current value.

13. A method of operating a memory cell that comprises a first junction region, a second junction region, a base, a nonconducting charge trapping layer and a gate, the method comprising:
    setting the memory cell to an initial state of a first gate threshold voltage;
    performing a processing sequence including:
    applying a voltage bias between the gate and the first junction region to cause electric hole to migrate towards and be retained in the trapping layer;
    evaluating a read current generated in response to the voltage bias to determine whether a second gate threshold voltage is reached, wherein the second gate threshold voltage is lower than the first gate threshold voltage; and
    repeating the processing sequence a number of time by varying one or more time the voltage bias between the gate and the first junction region until the second gate threshold voltage is reached and the memory cell is in a program state.

14. The method of claim 13, wherein applying a voltage bias between the gate and the first junction region comprises applying a positive voltage to the first junction region and a negative voltage to the gate.

15. The method of claim 13, wherein repeating the processing sequence a number of times by varying one or more time the voltage bias between the gate and the first junction region comprises repeating the processing sequence by applying voltage pulses of unequal magnitudes to the gate.

16. The method of claim 15, wherein repeating the processing sequence a number of times by varying one or more time the voltage bias between the gate and the first junction region further comprises repeating the processing sequence by applying voltage pulses of a constant magnitude to the first junction.

17. The method of claim 13, wherein repeating the processing sequence a number of times by varying one or more time the voltage bias between the gate and the first junction region comprises repeating the processing sequence by applying ramped voltage pulses to the gate.

18. The method of claim 17, wherein repeating the processing sequence a number of times by varying one or more time the voltage bias between the gate and the first junction region further comprises repeating the processing sequence by applying voltage pulses of a constant magnitude to the first junction.

19. The method of claim 13, wherein repeating the processing sequence a number of times by varying one or more time the voltage bias between the gate and the first junction region comprises repeating the processing sequence by applying voltage pulses of unequal magnitudes to the first junction region.

20. The method of claim 19, wherein repeating the processing sequence a number of times by varying one or more time the voltage bias between the gate and the first junction region further comprises repeating the processing sequence by applying voltage pulses of a constant magnitude to the gate.

21. The method of claim 13, wherein repeating the processing sequence a number of times by varying one or more time the voltage bias between the gate and the first junction region comprises repeating the processing sequence by applying ramped voltage pulses to the first junction.

22. The method of claim 21, wherein repeating the processing sequence a number of times by varying one or more time the voltage bias between the gate and the first junction region further comprises repeating the processing sequence by applying voltage pulses of a constant magnitude to the gate.

* * * * *